United States Patent
Kanter et al.

(10) Patent No.: US 7,516,380 B2
(45) Date of Patent: Apr. 7, 2009

(54) BIST TO PROVIDE JITTER DATA AND ASSOCIATED METHODS OF OPERATION

(75) Inventors: Ofir Kanter, Haifa (IL); Eran Peleg, Akko (IL)

(73) Assignee: Intel Corporation, Santa Clara, CA (US)

( * ) Notice: Subject to any disclaimer, the term of this patent is extended or adjusted under 35 U.S.C. 154(b) by 508 days.

(21) Appl. No.: 11/169,164

(22) Filed: Jun. 28, 2005

(65) Prior Publication Data
US 2006/0290398 A1    Dec. 28, 2006

(51) Int. Cl.
G01R 31/28    (2006.01)

(52) U.S. Cl. ...................................... 714/731
(58) Field of Classification Search ................. 714/731
See application file for complete search history.

(56) References Cited

U.S. PATENT DOCUMENTS

| | | | |
|---|---|---|---|
| 5,657,253 A | 8/1997 | Dreyer et al. | |
| 6,088,829 A * | 7/2000 | Umemura et al. | 714/798 |
| 6,430,720 B1 * | 8/2002 | Frey et al. | 714/744 |
| 6,564,347 B1 | 5/2003 | Mates | |
| 6,611,870 B1 * | 8/2003 | Asano et al. | 709/238 |
| 6,647,438 B1 | 11/2003 | Connor et al. | |
| 6,650,159 B2 | 11/2003 | Wang et al. | |
| 6,747,490 B1 | 6/2004 | Jaussi et al. | |
| 6,754,749 B1 * | 6/2004 | Mounsef et al. | 710/100 |
| 6,774,686 B2 | 8/2004 | Kennedy et al. | |
| 6,883,127 B2 * | 4/2005 | Slawecki et al. | 714/726 |
| 6,995,554 B2 | 2/2006 | Loke et al. | |
| 7,149,269 B2 * | 12/2006 | Cranford et al. | 375/373 |
| 7,191,371 B2 * | 3/2007 | Hsu et al. | 714/717 |
| 7,216,183 B2 * | 5/2007 | Ho et al. | 710/5 |
| 7,225,289 B2 * | 5/2007 | Tee et al. | 710/315 |
| 7,251,764 B2 * | 7/2007 | Bonneau et al. | 714/733 |
| 7,325,175 B2 | 1/2008 | Momtaz | |
| 2003/0005379 A1 * | 1/2003 | Slawecki et al. | 714/726 |
| 2003/0172327 A1 * | 9/2003 | Chen et al. | 714/700 |
| 2005/0076279 A1 | 4/2005 | Cranford et al. | |
| 2005/0193290 A1 | 9/2005 | Cho et al. | |
| 2005/0193301 A1 | 9/2005 | Partovi et al. | |
| 2006/0294442 A1 | 12/2006 | Kanter et al. | |

OTHER PUBLICATIONS

"U.S. Appl. No. 11/169,316, Non-Final Office Action mailed Aug. 21, 2008", 12 pgs.
"U.S. Appl. No. 11/169,316, Response filed Jun. 16, 2008 to Non Final Office Action mailed Mar. 14, 2008", 13 pgs.
"U.S. Appl. No. 11/169,316, Non-Final Office Action mailed Mar. 14, 2008", 19 pgs.

\* cited by examiner

*Primary Examiner*—James C Kerveros
(74) *Attorney, Agent, or Firm*—Schwegman, Lundberg & Woessner, P.A.

(57) ABSTRACT

In an embodiment, a transmitter circuit is in an integrated circuit die with a test latch, and the test latch is enabled by a test clock signal to under-sample the transmit signal from the transmitter circuit. In a method of operation, a transmit signal is generated in an integrated circuit die, and the transmit signal is under-sampled in a test latch in the integrated circuit triggered by a test clock signal. Output data from the test latch is transmitted to a test device that is separated from the integrated circuit die.

23 Claims, 4 Drawing Sheets

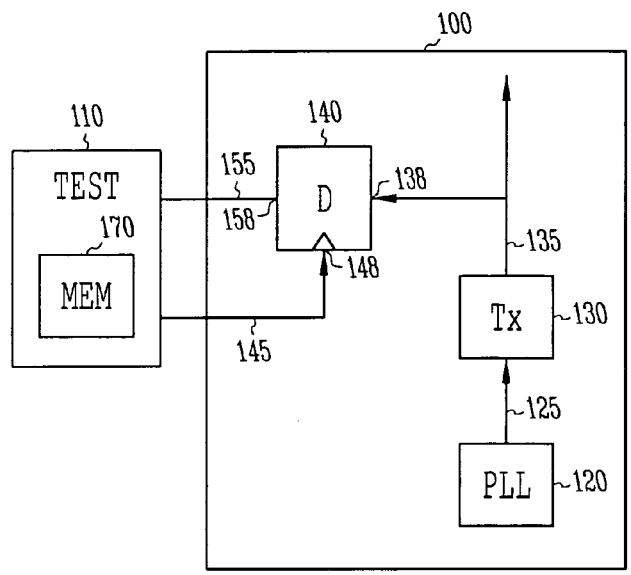
FIG. 1
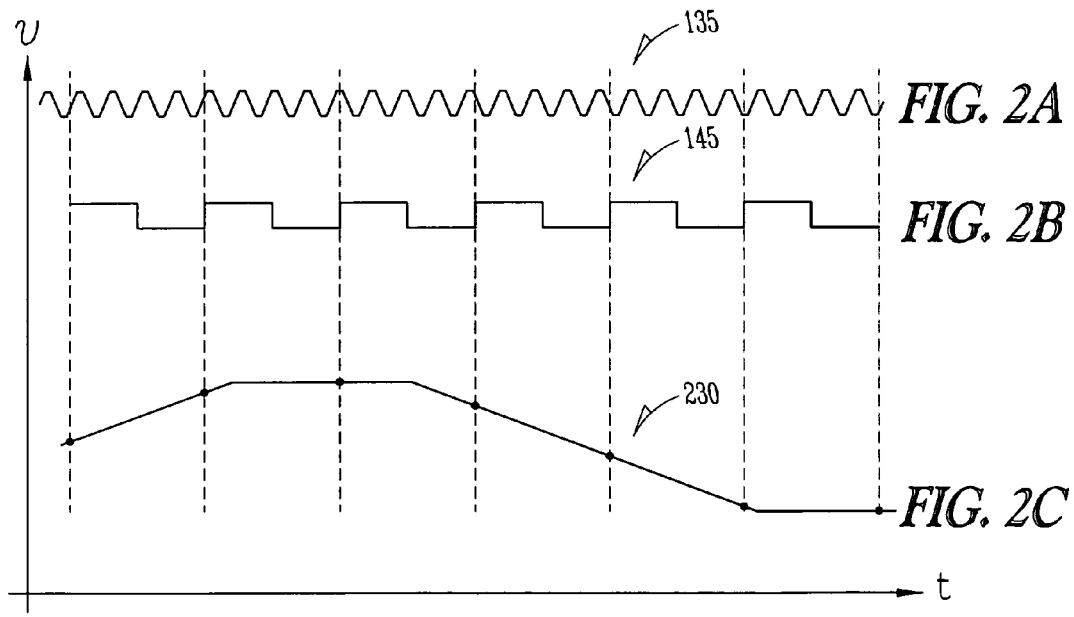
FIG. 2A
FIG. 2B
FIG. 2C

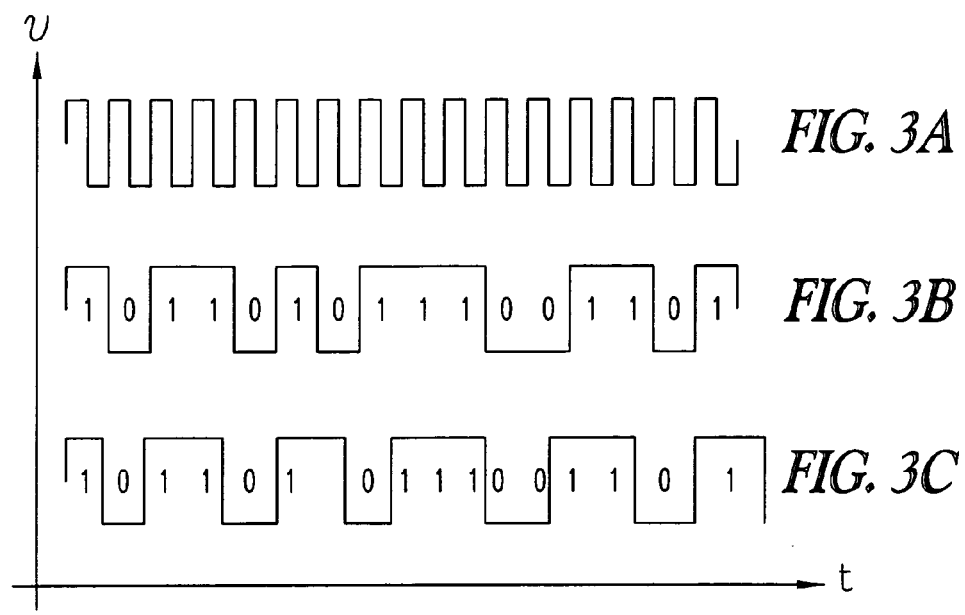
*FIG. 3A*
*FIG. 3B*
*FIG. 3C*
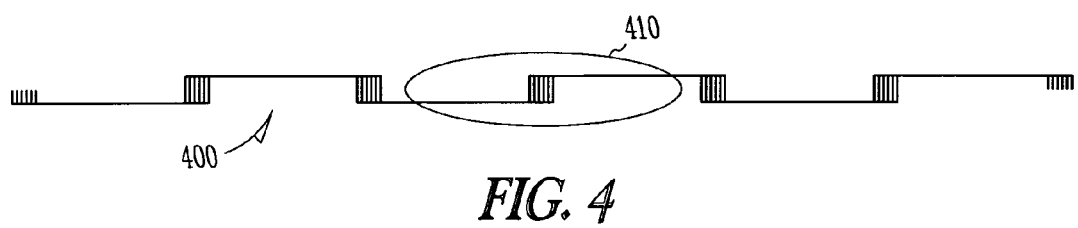
*FIG. 4*
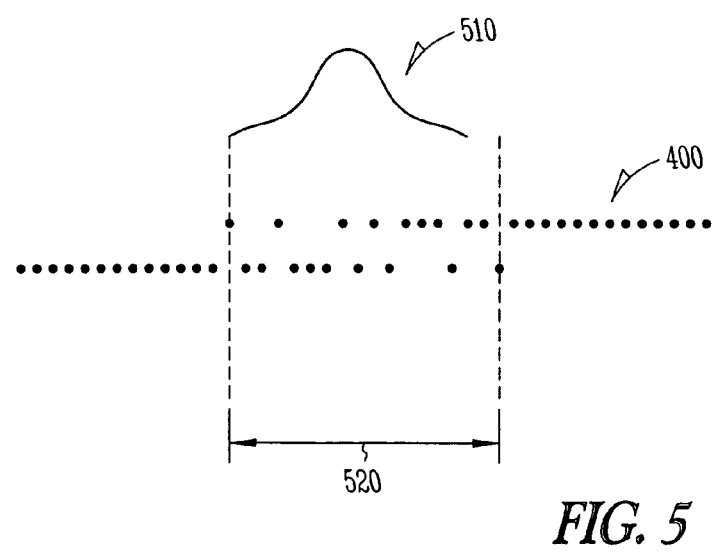
*FIG. 5*

BIST TO PROVIDE JITTER DATA AND ASSOCIATED METHODS OF OPERATION

TECHNICAL FIELD

This application relates generally to testing of integrated circuits and, more particularly, to a Built-In Self-Tester (BIST) to provide jitter data and associated methods of operation.

BACKGROUND

Jitter is a deviation or displacement of pulses in a high-frequency digital or analog signal. As the name suggests, jitter can be thought of as shaky pulses. Jitter is the variation of an event from its ideal position in time. Among the causes of jitter are electromagnetic interference and crosstalk with other signals. Jitter can cause a display monitor to flicker, affect the ability of the processor in a personal computer to perform as intended, introduce clicks or other undesired effects to audio signals, and cause the loss of data transmitted between network devices.

Measuring transmitter jitter of high speed input/outputs (I/Os) is one of the most complicated production tests. The complexity is due to the ambiguous ways to measure the jitter, the high frequency of the transmitted signal and the external dedicated instrument that gets the signal, post processes it, and provides an output as its' jitter. Yet, the importance of this parameter is critical, since according to the jitter value, the robustness of the transmitted signal is tested, and one concludes the chip's performance on real (customer) systems according to the jitter value. In one way to measure the jitter of a signal, one samples it in high frequencies, and via post processing, estimates a difference between the actual transitions and the theoretical transitions. The higher the signal's frequency is—the test becomes more important and difficult to implement, and the instrument that measures the jitter becomes more complex and expensive. Traditionally, signal frequencies rise over time, therefore the challenge is growing.

In conservative ways, transmit jitter is measured by a unique ad hoc external instrument attached to a tester.

There is a need for improved circuits and methods for testing integrated circuits for jitter.

BRIEF DESCRIPTION OF THE DRAWINGS

FIG. 1 is a block diagram of an integrated circuit die and a test device according to various embodiments;

FIG. 2A-2C is a plot of an under-sampling method according to various embodiments;

FIG. 3A-3C is a plot of a jittered signal;

FIG. 4 is a plot of multiple samples of a jittered signal according to various embodiments;

FIG. 5 is a plot of a Gaussian distribution according to various embodiments;

DETAILED DESCRIPTION

Figure 6:
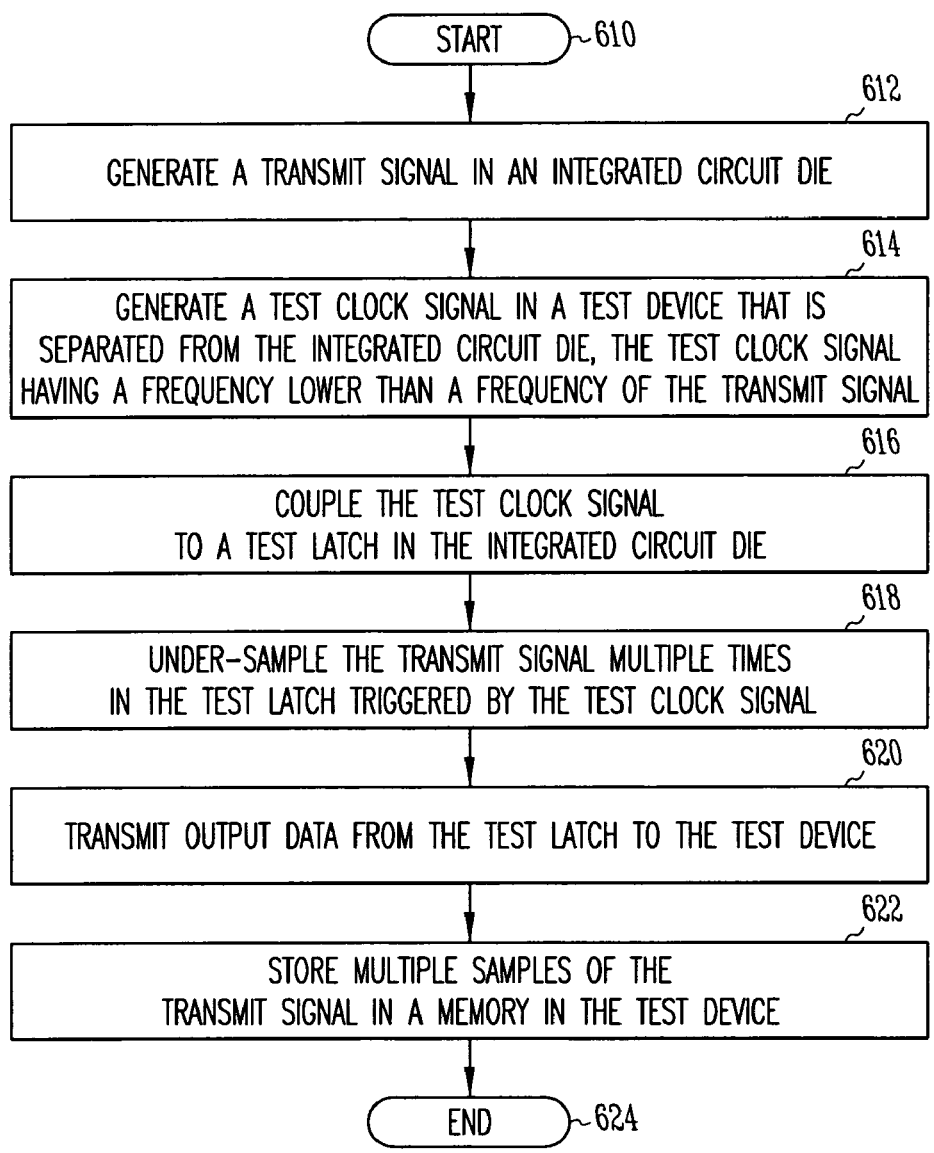
FIG. 6 is a flow diagram of several methods according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense. Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

According to various embodiments, an internal feature is added to the silicon of an integrated circuit chip that provides the main jitter components of high frequency transmit signals, externally based on a clean and low frequency reference clock signal driven from a tester. In particular, a precise latch is internal in the silicon that receives a transmit signal as an input and a low frequency precise clock (latch enable) from the tester. The transmit signal is to be measured for jitter. According to various embodiments, the transmit signal is under-sampled. Using the under-sampling method of the embodiments, the clock's frequency is low, and a simple tester can provide the clock. A latch output is transferred to the tester and then sampled into the tester's memory.

After the under-sampling is over, and enough information resides in the memory, post processing provides differences between the signal's actual transitions and theoretical transitions. The more data that is collected, the more information on jitter components can be provided, and test time is balanced against the accuracy of the results to determine how much data is collected.

FIG. 1 is a block diagram of an integrated circuit die 100 and a test device 110 according to various embodiments. The die 100 is a silicon chip, and elements of an integrated circuit are formed on the silicon chip. The test device 110 is separated from the integrated circuit die 100, and is not part of the same silicon chip.

A Phase Locked Loop (PLL) 120 is located on the die 100, and is coupled to a transmitter circuit 130 to provide a timing reference signal 125. The transmitter circuit 130 generates a high frequency transmit signal 135 based on the timing reference signal 125. The transmit signal 135 is coupled to a transmit signal input 138 of a test latch 140. The transmitter circuit 130 and the test latch 140 are also located on the die 100. The test latch 140 is coupled to receive a low frequency test clock signal 145 at a clock input 148. The test latch 140 is triggered or enabled by the test clock signal 145 to sample the transmit signal 135.

The test clock signal 145 is generated by the test device 110 and coupled to the die 100 including the test latch 140.

The test latch 140 transmits output data 155 through a data output 158 to the test device 110. The output data 155 includes samples of the transmit signal 135 sampled by the test latch 140. The output data 155 is stored in a memory 170 in the test device 110. The memory 170 is a Flash memory or a random access memory (RAM) or a disk drive storage device or any other type of appropriate memory.

Design for testability (DFT) features are included in an integrated circuit to provide for embedded testing of certain integrated circuit functions. A Built-In Self-Tester (BIST) is a DFT feature. The test latch 140 according to various embodiments is such a BIST.

FIG. 2A-2C is a plot of an under-sampling method according to various embodiments. The plots of FIG. 2A-2C show voltage v of signals with respect to time t. FIG. 2A is a plot of the high frequency transmit signal 135. FIG. 2B is a plot of a low frequency test clock signal 145. The transmit signal 135 is sampled in the test latch 140 via the test clock signal 145 to result in an under-sampled signal 230. FIG. 2C is a plot of a series of sample points of the under-sampled signal 230 connected by a line.

The output data 155 of the test latch 140 (including the samples of the transmit signal 135) are moved to the memory 170 in the test device 110. Post processing of the output data 155 estimates the transitions of the under-sampled signal 230, and estimates jitter in the transmit signal 135.

FIG. 3A-3C is a plot of a jittered signal. The plots of FIGS. 3A-3C show voltage v of signals with respect to time t. FIG. 3A is a plot of a reference clock signal. FIG. 3B is a plot of an ideal data signal. FIG. 3C is a plot of a jittered data signal. The jitter is a variation of the data signal from its ideal position in the time domain.

FIG. 4 is a plot of multiple samples 400 of a jittered signal according to various embodiments. The plot of FIG. 4 shows a voltage of the samples 400 with respect to time. The samples 400 are generated as the test latch 140 is triggered or enabled by the test clock signal 145, and samples for a single transition 410, or more, are collected. The samples 400 are transmitted from the test latch 140 to the tester 110, where they are stored in the memory 170.

FIG. 5 is a plot of a Gaussian distribution 510 generated from the samples 400 inside a transition window 520 according to various embodiments. The jitter of the samples 400 is estimated based on the variance of the Gaussian distribution 510.

FIG. 6 is a flow diagram of several methods according to various embodiments. In 610, the methods start.

In 612, a transmit signal is generated in an integrated circuit die.

In 614, a test clock signal is generated in a test device that is separated from the integrated circuit die, the test clock signal having a frequency lower than a frequency of the transmit signal.

In 616, the test clock signal is coupled to a test latch in the integrated circuit die.

In 618, the transmit signal is under-sampled multiple times in the test latch triggered by the test clock signal.

In 620, output data is transmitted from the test latch to the test device.

In 622, multiple samples of the transmit signal are stored in a memory in the test device.

The methods end in 624.

It should be noted that the individual activities shown in the flow diagram do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

Figure 7:
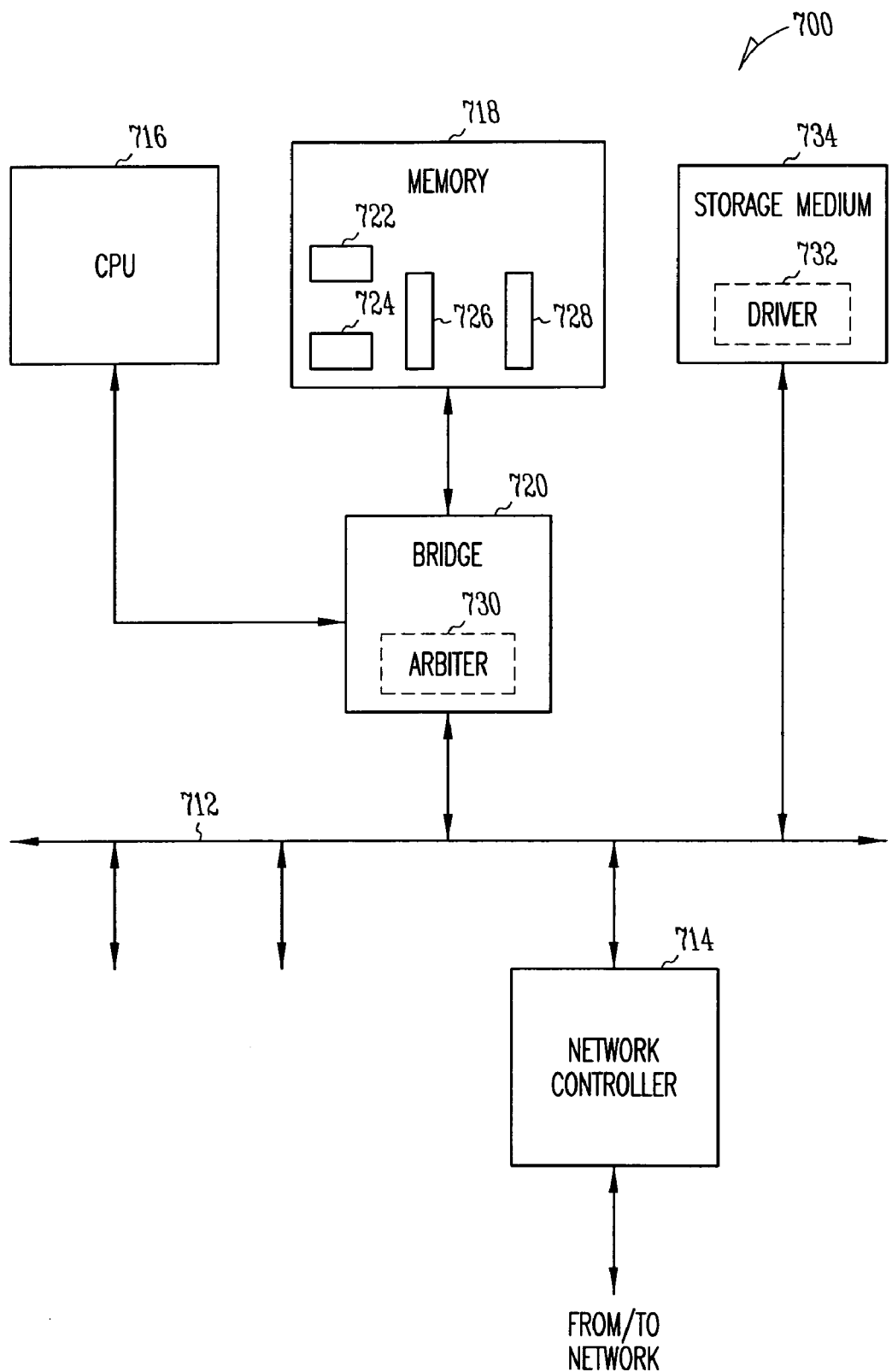
FIG. 7 is a block diagram of a system according to various embodiments.

FIG. 7 is a block diagram of a system 700 according to various embodiments. The following explanation regarding FIG. 7 is an example of how the die 100 is integrated in a system environment and is not for testing. The die 100 will be tested with a dedicated test device according to various embodiments.

The system 700 is a personal computer (PC), laptop computer, wireless device, switch, router, or the like having the capability to connect to a network (not shown). The system 700 includes a bus 712, which is a peripheral component interconnect express (PCI-E) bus, for example. It is to be appreciated that the bus 712 may be another type of bus, such as a universal serial bus (USB), serial deserial (SRDS), peripheral component interconnect (PCI) bus, or InfiniBand.

Several devices are directly or indirectly coupled to the bus 712. For instance, an input/output (I/O) controller or network controller 714 is coupled to the bus 712 and allows the system 700 to send/receive network data, typically in the form of packets or frames. In one embodiment, the network controller 714 (sometimes referred to as an "adapter") is an Ethernet media access controller (MAC) or network interface card (NIC). The network controller 714 can be another type of network controller, an I/O controller such as a small computer system interface (SCSI) controller, or a card. The network controller 714 includes a test latch and other hardware and implements methods according to one or more of the various embodiments presented herein.

A processor 716, such as a central processing unit (CPU), and a storage unit or memory 718 are coupled to the bus 712 via a bridge 720. The memory 718, referred to as a "host memory" or a "system memory," is a random access memory (RAM) and includes a plurality of data buffers 722, 724, 726, and 728.

To provide arbitration for the use of the bus 712 (e.g., when reading from or writing to the memory 718), the bridge 720 includes an arbiter 730. A driver 732 controls operation of the network controller 714 (when the network controller 714 is made a bus master by the arbiter 730), and performs other operations. The driver 732 is embodied in software that is stored in a machine-readable storage medium 734 coupled to the bus 712, such as a hard disk drive of the system 700. The driver 732 is executed by the processor 716. Execution of the software of the driver 732, during normal operation, can include copying this software into the memory 718 and/or into a cache (not shown) of the processor 716, and execution of this software from that location.

The various embodiments presented herein describe a way to get an indication of the jitter of a transmit signal according to a technique and to estimate transmit jitter in a very fast and cost effective way. All additional hardware necessary for the various embodiments presented herein is easily added to the silicon chip with very limited effort and cost. The various embodiments presented herein will contribute to lower manufacturing costs of chips by reducing production test costs.

The various embodiments presented herein can be implemented in an integrated circuit chip with a high speed bus interface such as PCI, PCI-E, SRDS, or Infiniband. Integrated circuits according to the various embodiments presented herein are formed in any type of semiconductor material, including silicon.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" may be used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. A method comprising:
   generating a first signal in an integrated circuit die;
   under-sampling the first signal multiple times in a test latch on the integrated circuit die triggered by a test clock signal, the test clock signal having a frequency lower than a frequency of the first signal; and
   transmitting multiple samples of the first signal from the test latch to a test device that is separated from the integrated circuit die.

2. The method of claim 1 wherein generating a first signal further comprises generating the first signal in a silicon chip.

3. The method of claim 1, further comprising:
   generating the test clock signal in the test device; and
   coupling the test clock signal to the test latch.

4. The method of claim 1 wherein transmitting multiple samples of the first signal further comprises storing the multiple samples of the first signal in a memory in the test device.

5. The method of claim 1 wherein generating a first signal further comprises:
   generating a reference signal in a Phase Locked Loop (PLL) on the integrated circuit die; and
   generating a transmit signal based on the reference signal in a transmitter circuit on the integrated circuit die.

6. The method of claim 1 wherein transmitting multiple samples of the first signal further comprises transmitting digital samples of the first signal from the test latch to the test device, the test device being coupled to the test latch.

7. An apparatus comprising:
   a signal source to provide a first signal having a first frequency, the signal source being on an integrated circuit die; and
   a test latch on the integrated circuit die, the test latch including:
      a first input coupled to receive the first signal;
      a clock input to receive a test clock signal, the test clock signal having a frequency lower than the first frequency; and
      a data output to provide samples of the first signal to a test device that is separated from the integrated circuit die, the test latch to under-sample the first signal in accordance with the test clock signal.

8. The apparatus of claim 7 wherein the die is a silicon chip.

9. The apparatus of claim 7 wherein the signal source comprises:
   a PLL to generate a reference signal; and
   a first circuit to receive the reference signal and to generate the first signal.

10. The apparatus of claim 9 wherein:
    the first circuit is a transmitter circuit; and
    the first signal is a transmit signal.

11. The apparatus of claim 7 wherein:
    the clock input is to be coupled to the test device to receive the test clock signal, the test device to generate the test clock signal; and
    the data output is to be coupled to the test device to transmit the samples of the first signal to the test device.

12. The apparatus of claim 11 wherein the test device includes a memory to store the samples of the first signal.

13. A system comprising:
    a peripheral component interconnect express (PCI-E) bus;
    a processor coupled to the PCI-E bus;
    a memory coupled to the PCI-E bus;
    a storage medium coupled to the PCI-E bus;
    a network controller coupled to the PCI-E bus, the network controller being located on an integrated circuit die and including:
       a signal source to provide a first signal having a first frequency, the signal source being on the integrated circuit die; and
       a test latch on the integrated circuit die, the test latch including:
          a first input coupled to receive the first signal;
          a clock input to receive a test clock signal, the test clock signal having a frequency lower than the first frequency; and
          a data output to provide samples of the first signal to a test device that is separated from the integrated circuit die, the test latch to under-sample the first signal in accordance with the test clock signal.

14. The system of claim 13 wherein:
    the processor is a central processing unit (CPU);
    the memory includes a random access memory (RAM) and a plurality of data buffers; and
    the storage medium includes a hard disk drive including a driver.

15. The system of claim 13, further comprising a bridge coupled between the processor, the memory, and the PCI-E bus, the bridge including an arbiter.

16. The system of claim 13 wherein the signal source comprises:
    a PLL to generate a reference signal; and
    a transmit circuit to receive the reference signal and to generate a transmit signal.

17. The system of claim 13 wherein the die is a silicon chip.

18. A method comprising:
    generating a transmit signal in an integrated circuit die;
    under-sampling the transmit signal multiple times in a test latch on the integrated circuit die triggered by a test clock signal, the test clock signal having a frequency lower than a frequency of the transmit signal; and
    transmitting multiple samples of the transmit signal from the test latch to a test device that is separated from the integrated circuit die.

19. The method of claim 18 wherein generating a transmit signal further comprises generating the transmit signal in a silicon chip.

20. The method of claim 18, further comprising:
    generating the test clock signal in the test device; and
    coupling the test clock signal to the test latch.

21. The method of claim 18 wherein transmitting multiple samples of the transmit signal further comprises storing the multiple samples of the transmit signal in a memory in the test device.

22. The method of claim 18 wherein generating a transmit signal further comprises:
   generating a reference signal in a Phase Locked Loop (PLL) on the integrated circuit die; and
   generating the transmit signal based on the reference signal in a transmitter circuit on the integrated circuit die.

23. The method of claim 18 wherein transmitting multiple samples of the transmit signal further comprises transmitting digital samples of the transmit signal from the test latch to the test device, the test device being coupled to the test latch.

* * * * *